United States Patent
Blume et al.

(10) Patent No.: US 6,480,752 B1
(45) Date of Patent: Nov. 12, 2002

(54) FINAL OPERATING ELEMENT POSITIONING DEVICE

(75) Inventors: Jochen Blume, Darmstadt (DE); Herbert Breinich, Wiesbaden (DE); Peter Schmidt, Bad Homburg (DE)

(73) Assignee: Mannesmann VDO AG, Frankfurt (DE)

( * ) Notice: Subject to any disclaimer, the term of this patent is extended or adjusted under 35 U.S.C. 154(b) by 0 days.

(21) Appl. No.: 09/381,553
(22) PCT Filed: Aug. 5, 1998
(86) PCT No.: PCT/EP98/01242
§ 371 (c)(1),
(2), (4) Date: Dec. 14, 1999
(87) PCT Pub. No.: WO98/43047
PCT Pub. Date: Oct. 1, 1998

(30) Foreign Application Priority Data

Mar. 21, 1997 (DE) .......................... 197 12 049

(51) Int. Cl.⁷ .................................................. G01D 5/14
(52) U.S. Cl. .............................. 700/56; 345/156; 700/85
(58) Field of Search ................................ 700/56, 65, 83, 700/85; 702/41; 345/701, 702, 156, 157, 184

(56) References Cited

U.S. PATENT DOCUMENTS

| | | | | |
|---|---|---|---|---|
| 5,592,058 A | * | 1/1997 | Archer et al. ............... | 318/254 |
| 5,986,419 A | * | 11/1999 | Archer et al. ............... | 318/254 |
| 5,999,168 A | * | 12/1999 | Rosenberg et al. ......... | 345/161 |
| 6,050,718 A | * | 4/2000 | Schena et al. .............. | 364/190 |
| 6,065,365 A | * | 5/2000 | Ostler et al. ................ | 74/528 |

FOREIGN PATENT DOCUMENTS

| | | |
|---|---|---|
| DE | 3937149 | 5/1990 |
| EP | 0677933 | 10/1995 |

OTHER PUBLICATIONS

Patent Abstracts of Japan vol. 7, No. 290 (P–245), Dec. 24, 1983 & JP 58 162813 A (Tokyo Shibauru Denki KK), Sep. 27, 1983.

* cited by examiner

Primary Examiner—Paul P. Gordon
(74) Attorney, Agent, or Firm—Martin A. Farber

(57) ABSTRACT

In a control device for manually inputting information into a device, having a final control element whose position can be changed under the effect of an activation force and which is connected to a converter for generating electrical signals which characterize the position of the final control element, and having a motor element which is connected to the final control element and which exerts, under the control of the electrical signals, a force on the final control element, the size and direction of which force is dependent on the position of the final control element and/or on the information which is to be input, there is provision for the converter to be composed of the rotor (3) of the motor element and sensors (9, 10) which respectively emit an electrical signal as a function of the position of the rotor.

16 Claims, 3 Drawing Sheets

Fig. 5
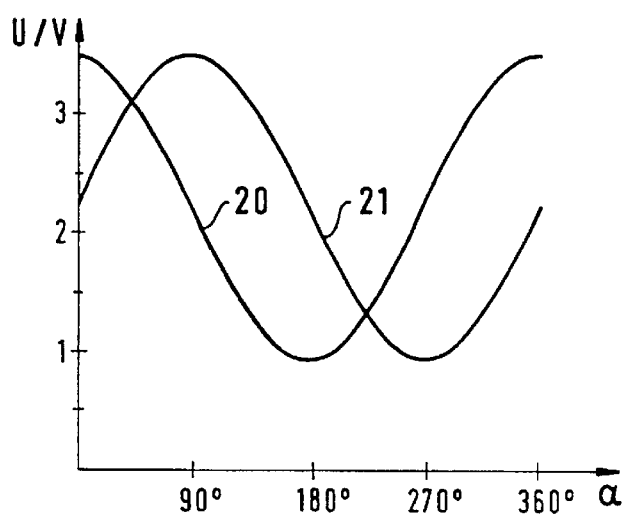
Fig. 6a
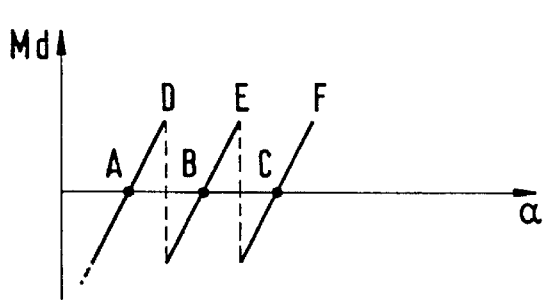
Fig. 6b
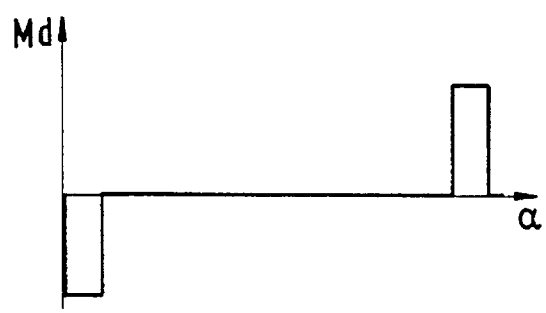
Fig. 6c
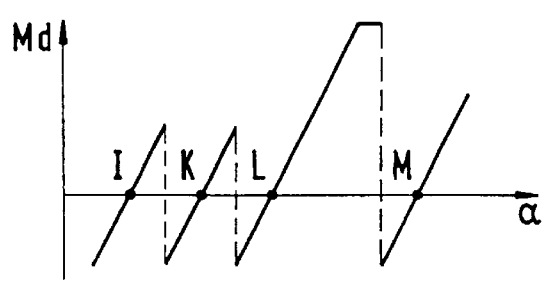
Fig. 6

FINAL OPERATING ELEMENT POSITIONING DEVICE

FIELD AND BACKGROUND OF THE INVENTION

The invention relates to a control device for manually inputting information into a device, having a final control element whose position can be changed under the effect of an activation force and which is connected to a converter for generating electrical signals which characterize the position of the final control element, and having a motor element which is connected to the final control element and which exerts, under the control of the electrical signals, a force on the final control element, the size and direction of the force being dependent on the position of the final control element and/or on the information which is to be input. From the prior art, it is known to connect the final control element to a converter in the form of an incremental position encoder via a shaft and to a motor via a further shaft.

It is a further disadvantage here that because of the additional incremental position encoder, this design requires a large amount of space. For this reason, the object of the invention is to specify a corresponding control device with a haptic feedback which requires only a small amount of space.

This object is achieved by virtue of the fact that the converter is composed of a rotor of the motor element and sensors which respectively emit an electrical signal as a function of the position of the rotor. The rotor of the motor element therefore also fulfills the additional function of an angular position encoder of the converter. The invention thus provides the advantage that only the additional sensors are necessary for the converter. A rotor which is designed as a diametrically magnetized disk provides a simple and economical solution for the rotor. In conjunction with at least two Hall sensors, it is possible to determine the precise rotary angle within the range of 360° from the voltages which the magnetic field of the diametrically magnetized disk brings about in the Hall sensors. Two Hall sensors are completely sufficient for this.

If the two Hall sensors are arranged offset by 90° with the same radial interval in the direction of rotation, the position of the rotor can be calculated particularly easily.

By using a pair of cross coils it is possible to make the motor element of a very compact design. Furthermore, any desired torque characteristic at any desired angle can be achieved by respectively actuating the two coils in different ways. The torque characteristic and the angle can thereby be correspondingly adjusted as desired by changing the actuation. The desired moment characteristic curves are stored in a memory and can be read out of it. Thus, different torques can be generated depending on which data are read in. Thus, for example when the volume is adjusted by means of a corresponding moment profile, catch positions can be simulated while during the adjustment of the volume of individual loudspeakers of a device (balance, fader), a speed-proportional friction is simulated which gives the person using the control device a sensation of adjusting a potentiometer.

By using a coil former onto which the coils are wound, the motor element with the coils can be manufactured in a simple and robust way. The motor is prevented from becoming dirty by virtue of the fact that the coil former completely encloses the rotor.

The torque acting on the final control element can be increased by using a gear mechanism between the motor element and the final control element. The embodiment of the final control element as an adjusting knob can be manually controlled satisfactorily.

The sensors are particularly easy to mount if they are arranged on a printed circuit board which is mounted underneath the coil and/or the coil former.

By enclosing the underside and largely also the sides of the control device with a magnetic return pot, additional protection against contamination is obtained. The use of magnetically soft material with a high hysteresis provides, on the one hand, shielding of interference in the form of electromagnetic fields which are produced within the control device and which would otherwise penetrate to the outside as well as in the form of fields which would otherwise act on the control device from the outside. A high level of hysteresis also simplifies control by virtue of a high attenuation of the magnetic circuit. Furthermore, a material such as St 37, for example, is particularly inexpensive. In addition, a magnetic return pot made of magnetically soft material raises the working point of the magnet and thus increases its efficiency.

BRIEF DESCRIPTION OF THE DRAWINGS

The invention is explained below with reference to the figures of the drawings for particularly preferred exemplary embodiments, in which FIG. 5 shows the profile of signals which are supplied by two Hall sensors, FIG. 6 shows possible torque profiles which can be generated with the control device.

DETAILED DESCRIPTION OF THE PREFERRED EMBODIMENTS

Figure 1:
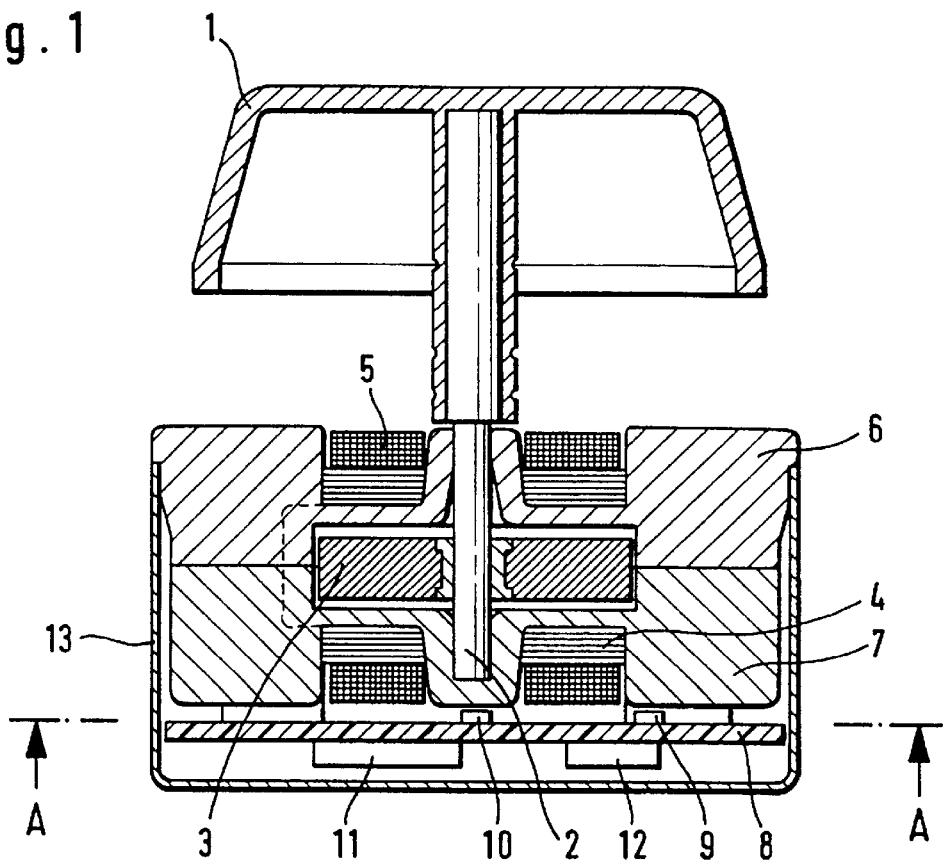
FIG. 1 shows the section through a first exemplary embodiment.

The control device in FIG. 1 has a final control element in the form of a rotary knob 1 which is connected via a shaft 2 to a rotor 3 in the form of a diametrically magnetized disk. The rotor 3 interacts with the fields generated in the coils 4, 5 and thus generates a rotary movement or a torque. The coils 4, 5 are each divided into two halves and are wound onto a coil former composed of a coil former upper part 6 and a coil former lower part 7. The coil former 6, 7 is embodied in such a way that the rotor 3 is completely enclosed. Hall sensors 9, 10 are mounted on a printed circuit board 8 in such a way that they are arranged offset by 90° with the same radial interval from the axis of rotation of the rotor 3. The rotary angle of the rotor 3, and thus also of the rotary knob 1, is calculated in the evaluation device 11 from the voltages which are generated in the Hall sensors 9, 10 by the magnetic field of the rotor 3. The voltages which are necessary in the coils 4, 5 in order to generate the desired torques as a result of the interaction of the rotor 3 with the current via the coils 4, 5 are then generated in the device 12. This takes place as a function of the calculated rotary angle and/or of the information which is to be specified.

A magnetic return pot 13 encloses the coil former 6, 7 on its underside and largely on its sides. The printed circuit board 8 with the Hall sensors 9, 10, the evaluation device 11 and the device 12 is also accommodated in the space formed from the underside of the coil former lower part 7 and the magnetic return pot 13.

Figure 2:
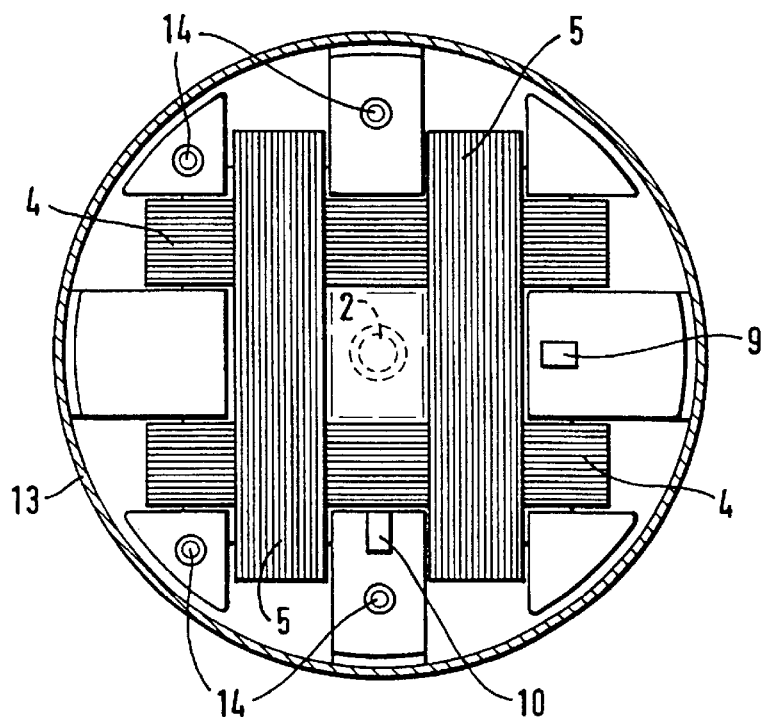
FIG. 2 shows the section A—A from FIG. 1.

The position of the Hall sensors 9, 10 and the coils 4, 5 is illustrated in more detail in FIG. 2. It is apparent that the Hall sensors 9, 10 are at the same radial interval from the shaft 2, and thus from the axis of rotation of the rotor 3 (not illustrated in FIG. 2), and that they are arranged offset by 90°. The coils 4, 5 are electrically connected to the device 12 via four contact pins 14 and conductor tracks (not illustrated) on the printed circuit board 8.

Figure 3:
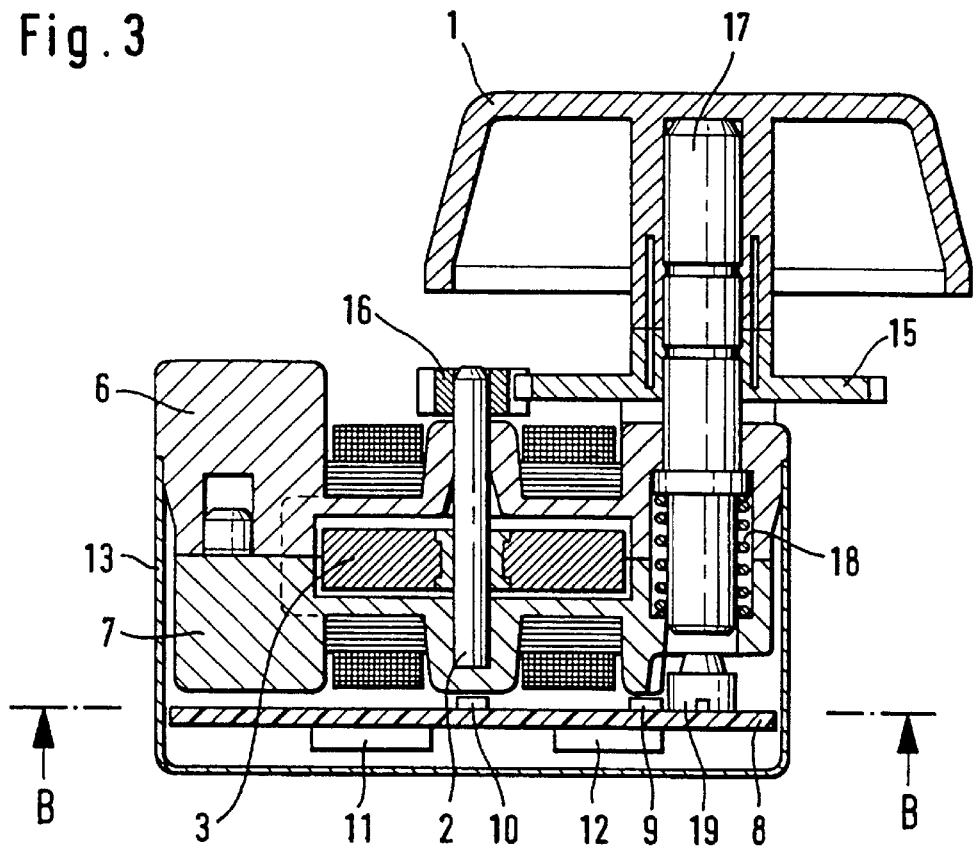
FIG. 3 shows the section through a second exemplary embodiment.
Figure 4:
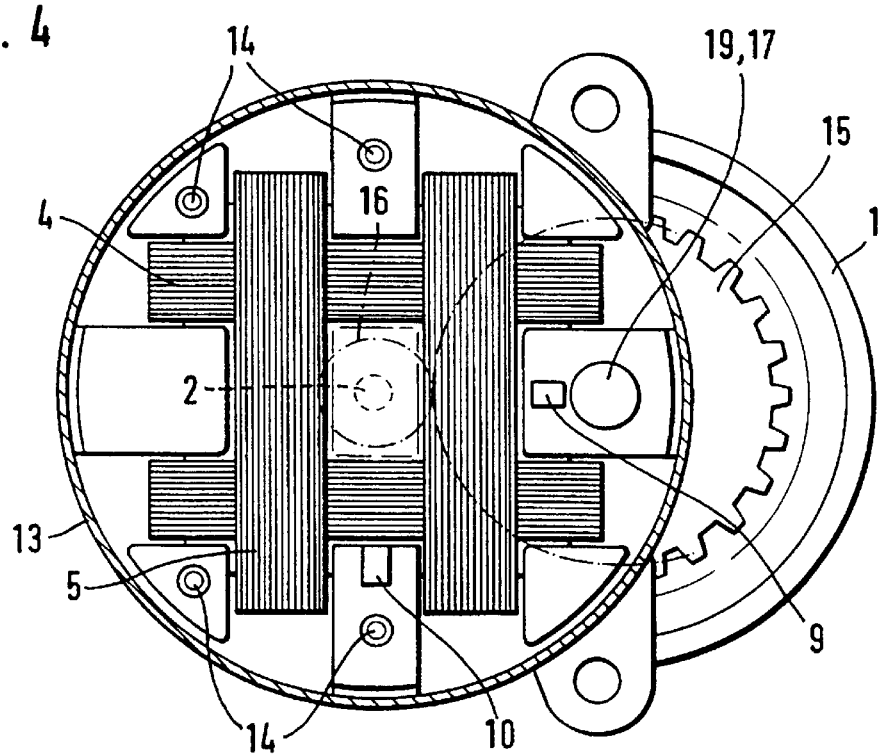
FIG. 4 shows the section B—B from FIG. 3.

The exemplary embodiment illustrated in FIGS. 3 and 4 differs from the exemplary embodiment described previously mainly in that the rotary knob 1 is not arrange directly on the shaft 2 but rather on an adjustment shaft 17 which is connected to the shaft 2 via a gear mechanism composed of the gearwheel 15 and the pinion 16, the pinion 16 being situated on the shaft 2. The adjustment shaft 17 also has the particular feature that it can be moved, together with the rotary knob 1, in the axial direction counter to the force of a compression spring 18 and a momentary-contact control switch 19 can be actuated as a result. The other components correspond to the components of the exemplary embodiment from FIGS. 1 and 2. The torque applied to the rotary knob 1 is increased by the gear mechanism composed of the gearwheel 15 and the pinion 16. By means of the momentary-contact control switch 19 it is possible, for example, to select a menu item by pressing, if the control device has the function of displaying different menu items by rotating the rotary knob 1 and, in the case of a succession of individual menu items, of selecting the displayed menu item or selecting a highlighted menu item giving simultaneous display of a plurality of menu items, in which case other displayed menu items can also be highlighted in succession by rotating the rotary knob 1.

FIG. 5 illustrates voltages 20, 21 which supply the Hall sensors 9, 10 as a function of the position of the rotor 3. It is apparent that the position of the rotor can be determined unambiguously with the voltages 20, 21 which are measured at a position of the rotor 3.

FIG. 6 illustrates possible torque profiles which can be realized with the control device according to the invention.

FIG. 6a illustrates a profile of the torque Md of the motor element as a function of the rotary angle α which simulates engagement points A, B, C. If the angle α is enlarged manually starting from these engagement points, a positive torque Md which is directed counter to the activation force and has a tendency to reduce the angle α is generated. If the operator overcomes one of the points D, E as a result of a corresponding application of force, the torque Md which is generated in the motor element reverses its direction so the rotary knob is also moved onto the following engagement point B, C, that is to say engages, without an external application of force. The same applies to the manual movement in the opposite direction. Such a torque profile can be generated if, for example, the volume of a car radio is to be controlled using the control device.

FIG. 6b illustrates a torque profile which simulates sprung stops at the ends of the adjustment range. Such a torque profile can be used advantageously if, for example, the frequency of a radio receiver is to be set using the control device.

The engagement points I, K, L, M are also simulated in FIG. 6c. Here, in contrast to FIG. 6a, the engagement point M can be reached by the engagement point L only if a particularly large manual force is applied in order to overcome the high torque. Such a profile can be used advantageously if different menu items are to be capable of being selected using the control device and the menu item which corresponds to the engagement position M is to be selected only in specific cases, and the operator is to be made aware of this by the high force which has to be applied.

The torque curve can also be configured in such a way that when a specific angle α is exceeded, the motor element continues to turn the rotary knob with a constant or variable speed. Furthermore, the motor element can move the rotary knob backward and forward between two angles so that the user has a vibrating sensation.

We claim:

1. A control device for manually inputting information into a device, having a final control element whose position can be changed under an effect of an activation force and which is connected to a converter for generating electrical signals which characterize the position of the final control element, and having a motor element comprising a rotor, the motor element which is connected to the final control element and which exerts, under the control of the electrical signals, a force with a size and direction on the final control element, the size and direction of which force is dependent on the position of the final control element and/or on the information which is to be input, wherein the converter is composed of the rotor (3) of the motor element and sensors (9, 10) which respectively emit an electrical signal as a function of the position of the rotor.

2. The control device as claimed in claim 1, wherein the rotor (3) is composed of a diametrically magnetized disk.

3. The control device as claimed in claim 1, wherein the sensors (9, 10) are Hall sensors.

4. The control device as claimed in claim 3, wherein two Hall sensors (9, 10) are present.

5. The control device as claimed in claim 4, wherein the Hall sensors (9, 10) are arranged offset by 90°, with a same radial interval, in the direction of rotation.

6. The control device as claimed in claim 1, wherein the sensors are composed of reed contacts.

7. The control device as claimed in one of the claim 1, wherein the motor element has a pair of cross coils (4, 5).

8. The control device as claimed in claim 7, wherein a device is present for energizing the pair of cross coils (4, 5) in order to generate predefined moment characteristic curves, in which device there is a memory element for storing the moment characteristic curve.

9. The control device as claimed in claim 8, wherein the moment characteristic curves can be read out of the memory.

10. The device as claimed in claim 7, wherein the coils (4, 5) are wound onto a coil former (6, 7).

11. The control device as claimed in claim 10, wherein the coil former (6, 7) completely encloses the rotor (3).

12. The control device as claimed in claim 1, wherein there is a gear mechanism (15, 16) between the final control element (1) and the motor element (3, 4, 5).

13. The control device as claimed in claim 1, wherein the final control element (1) is implemented as an adjusting knob.

14. The control device as claimed in claim 1, wherein the sensors (9, 10) are arranged on a printed circuit board which is located underneath the coil and/or the coil former.

15. The control device as claimed in claim 1, wherein it is enclosed on its underside, and largely on its sides, by a return pot (13).

16. The control device as claimed in claim 15, wherein the return pot (13) is made of magnetically soft material with a high magnetic hysteresis.

* * * * *

UNITED STATES PATENT AND TRADEMARK OFFICE
CERTIFICATE OF CORRECTION

PATENT NO.   : 6,480,752 B1
DATED        : November 12, 2002
INVENTOR(S)  : Jochen Blume et al.

It is certified that error appears in the above-identified patent and that said Letters Patent is hereby corrected as shown below:

<u>Title page,</u>
Item [22], PCT Filed, change "Aug. 5, 1998" to -- March 5, 1998 --.

Signed and Sealed this

Fourth Day of November, 2003

JAMES E. ROGAN
*Director of the United States Patent and Trademark Office*